(12) United States Patent
Yabuuchi et al.

(10) Patent No.: US 10,971,219 B2
(45) Date of Patent: Apr. 6, 2021

(54) SEMICONDUCTOR DEVICE

(71) Applicant: RENESAS ELECTRONICS CORPORATION, Tokyo (JP)

(72) Inventors: Makoto Yabuuchi, Tokyo (JP); Shinji Tanaka, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/668,768

(22) Filed: Oct. 30, 2019

(65) Prior Publication Data
US 2020/0202923 A1    Jun. 25, 2020

(30) Foreign Application Priority Data
Dec. 19, 2018    (JP) .............................. JP2018-237192

(51) Int. Cl.
| | | |
|---|---|---|
| G11C 11/419 | (2006.01) | |
| G11C 5/14 | (2006.01) | |
| G11C 11/412 | (2006.01) | |
| H01L 27/11 | (2006.01) | |

(52) U.S. Cl.
CPC .............. G11C 11/419 (2013.01); G11C 5/14 (2013.01); G11C 11/412 (2013.01); H01L 27/1108 (2013.01)

(58) Field of Classification Search
CPC ....... G11C 11/419; G11C 5/14; G11C 11/412; H01L 27/1108

USPC .......................................................... 365/154
See application file for complete search history.

(56) References Cited

U.S. PATENT DOCUMENTS

| | | | |
|---|---|---|---|
| 8,547,723 B2 | 10/2013 | Tanaka et al. | |
| 2012/0224405 A1* | 9/2012 | Tanaka ..................... | G11C 5/06 365/72 |
| 2016/0180923 A1* | 6/2016 | Kamohara .......... | H01L 27/1203 365/156 |
| 2018/0144790 A1* | 5/2018 | Yamaoka ............... | G11C 5/146 |

FOREIGN PATENT DOCUMENTS

JP    2012-185882 A    9/2012

* cited by examiner

*Primary Examiner* — Fernando Hidalgo
(74) *Attorney, Agent, or Firm* — McDermott Will & Emery LLP

(57) ABSTRACT

A semiconductor device capable of improving operating margins is provided. The semiconductor device comprises a memory circuit including a memory cell comprised of a SOTB transistor, and a mode designation circuit switching operation modes of the memory circuit for a first mode or a second mode. The memory circuit includes a substrate bias generation circuit supplying a substrate bias voltage to the SOTB transistor and a timing signal generation circuit generating a timing signal used for a reading operation or a writing operation of the memory circuit. The substrate bias generation circuit does not supply the substrate bias voltage to the SOTB transistor in the second mode.

12 Claims, 12 Drawing Sheets

FIG. 5

|  | WITHOUT SUBSTRATE BIAS | WITH SUBSTRATE BIAS |
|---|---|---|
| VCC(V) | 0.8 | |
| $\sigma$Vth(V) | 0.02 | |
| Vth(V) | 0.4 | 0.6 |
| worst Vth (5.5$\sigma$) | 0.51 | 0.71 |
| Ids_cell | $0.48^{\alpha}$ | $0.28^{\alpha}$ |
|  | 1 | 0.173 |
| Ids_delay | $0.6^{\alpha}$ | $0.4^{\alpha}$ |
|  | 1 | 0.354 |

SEMICONDUCTOR DEVICE

CROSS-REFERENCE TO RELATED APPLICATIONS

The disclosure of Japanese Patent Application No. 2018-237192 filed on Dec. 19, 2018 including the specification, drawings and abstract is incorporated herein by reference in its entirety.

BACKGROUND

The present disclosure relates to a semiconductor device.

In recent years, as the semiconductor device has been miniaturized, variations in MOS transistors have become remarkable. As a result, for example, in a memory unit (typically SRAM (Static Random Access Memory) modules) included in a semiconductor device, it is essential to consider variations in SRAM cells when performing a timing design. Japanese Unexamined Patent Application Publication 2012-185882 discloses a technique for performing a timing design, considering variations in SRAM cells.

On the other hand, as a technique for reducing power consumed by the semiconductor device, there is a technique for applying a substrate bias voltage to a semiconductor device board. Since the threshold voltage of the SRAM cell is increased by an application of substrate bias voltage, a leakage current can be reduced.

SUMMARY

However, even when the timing design is performed considering the variation of the SRAM cell, since the threshold voltage changes when the substrate bias voltage is applied, the operation timing needs to be adjusted differently from an operation timing in a normal time.

The present disclosure has been made to solve the above-mentioned problem, and the present disclosure provides a semiconductor device capable of improving an operation margin.

Other problems and novel features will become apparent from the description of this specification and the accompanying drawings.

A semiconductor device in accordance with certain aspect of the present disclosures comprises a memory circuit formed of SOTB (Silicon on Thin Buried Oxide) transistors, and a mode designation circuit designating an operation speed of the memory circuit. The memory circuit includes a memory array arranged in a matrix, a substrate bias generation circuit capable of supplying substrate bias voltage to the SOTB transistor, and a timing signal generation circuit for generating timing signal used for reading/writing operation of the memory array. The substrate bias generation circuit provides the substrate bias voltage to the SOTB transistor if the mode designation circuit designates a first operation mode that causes the memory circuit to operate in a first speed. If the mode designation circuit designates a second operation mode that causes the memory circuit to operate at a second speed faster than the first speed, then substrate bias voltage is not provided to the SOTB transistor. The timing signal generation circuit generates a first timing signal with a first delay stage if the first operation mode is designated, and generates a second timing signal with a second delay stage if the second operation mode is designated.

According to one Embodiment, the disclosed semiconductor device can improve the operating margin.

BRIEF DESCRIPTION OF THE DRAWINGS

FIG. 5 is a diagram to explain changes in characteristics of MOS transistors when a substrate bias voltage according to the first embodiment is applied and when the substrate bias voltage is not applied.

DETAILED DESCRIPTION

Figure 1:
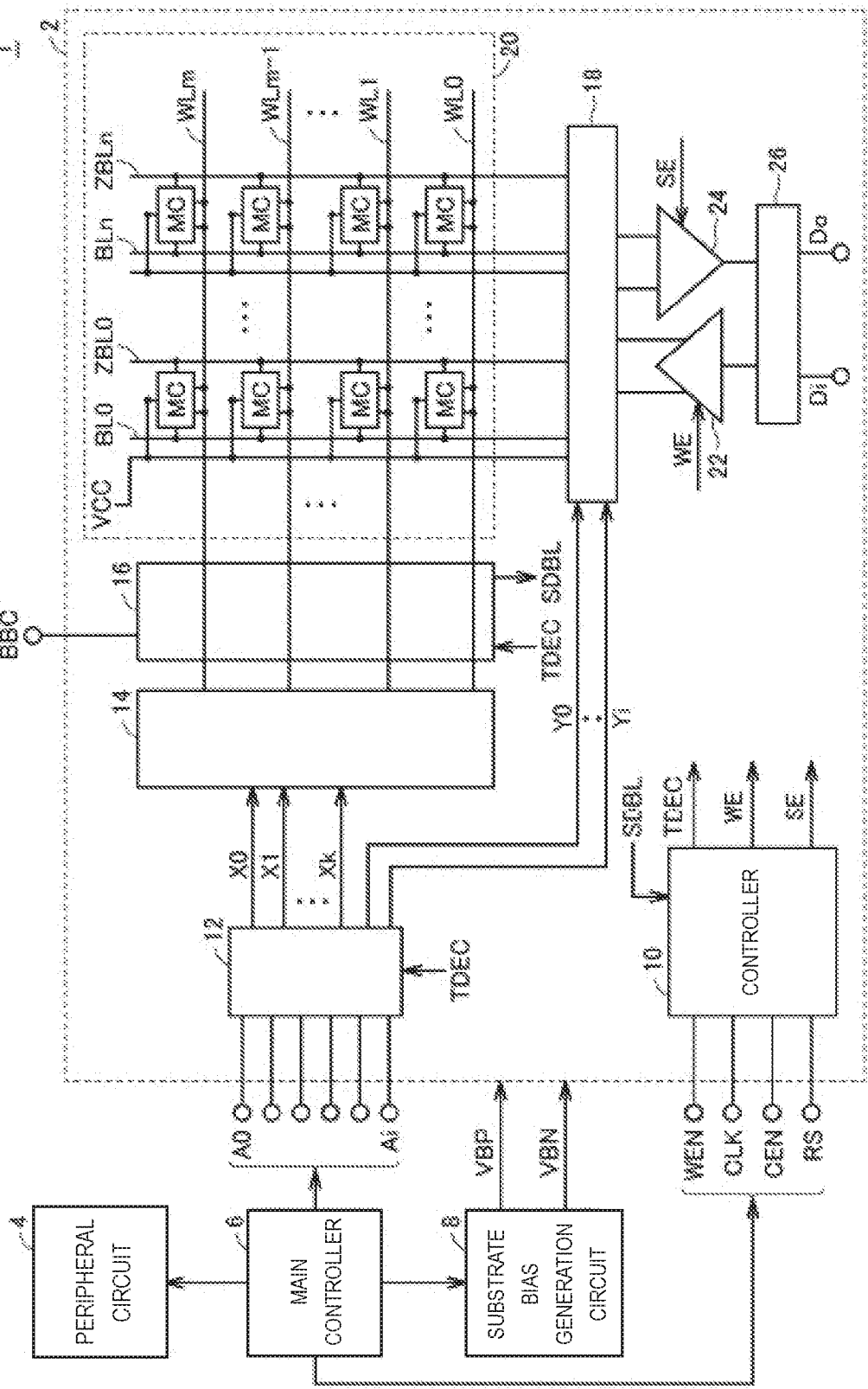
FIG. 1 is a diagram illustrating a semiconductor device 1 according to a first embodiment.

Embodiments will be described in detail with reference to the drawings. In the drawings, the same or corresponding components are denoted by the same reference numerals, and description thereof will not be repeated.

First Embodiment

FIG. 1 is a diagram illustrating a semiconductor device 1 according to a first embodiment.

Referring to FIG. 1, a semiconductor device 1 according to the first embodiment includes a memory unit 2, a peripheral circuit 4, a main controller 6, and a substrate bias generation circuit 8. The semiconductor device 1 has two operation speed modes. The semiconductor device 1 has a low speed mode (first operation mode) operating at a low speed and a normal mode (second operation mode) operating at a higher speed than the low speed mode.

The main controller 6 controls the entire semiconductor device 1. The peripheral circuit 4 is a logic circuit or the like.

The substrate bias generation circuit 8 generates a substrate bias to the memory unit 2 and outputs the substrate bias. In this embodiment, the substrate bias voltages VBP and VBN are outputted to the memory unit 2.

The main controller 6 outputs various control signals for controlling the memory unit 2. The main controller 6 can select and designate the normal mode as the operation speed of the memory unit 2 and the low speed mode operating at the speed lower than the normal mode.

The main controller 6 instructs the substrate bias generation circuit 8 when in the low speed mode, and the substrate bias generation circuit 8 supplies the memory unit 2 with the substrate bias voltage VBP for the P-channel MOS transistor and the substrate bias voltage VBN for the N-channel MOS transistor. On the other hand, in the normal mode, the substrate bias voltage VBP and the substrate bias voltage VBN are not supplied. Not supplying substrate bias voltage VBP and VBN means that the potential of the source and the substrate (well regions) of the respective P-channel MOS and N-channel MOS are substantially the same (zero bias voltage is supplied). To give an example, substrate bias voltage VBP is voltage VDD and substrate bias voltage VBN is 0V.

Memory unit 2 includes an address control circuit 12, a word line drive circuit 14, a timing adjustment circuit 16, a memory array 20, a column selection circuit 18, a controller 10, a write driver 22, a sense amplifier circuit 24, and an I/O buffer circuit 26.

The memory array 20 includes (m+1) numbers of word lines WL0 to WLm extended in a first direction, (n+1) numbers of pairs of bit lines (BL0, ZBL0) to (BLn, ZBLn) extended in a second direction crossing the first direction, and a plurality of memory cells MC arranged at intersections of the (m+1) numbers of word lines and the (n+1) numbers of pairs of bit lines. Each pair of bit lines is composed of two bit lines (e.g., BL0 and ZBL0) for transmitting complementary signals.

The address control circuit 12 decodes (or predecodes) address signals A0 to Aj from an external address terminal of the memory unit 2, triggered by a control signal TDEC, and outputs row selection signals X0 to Xk and column selection signals Y0 to Yi.

The word line drive circuit 14 selects (activates) any one of (m+1) number of word lines in response to the row select signals X0 to Xk.

The column selection circuit 18 selects any one of the (n+1) numbers of pairs of bit lines in accordance with the column selection signals Y0 to Yi.

The timing adjustment circuit 16, one of the main features of the embodiment, outputs a control signal SDBL by being input a control signal TDEC, which will be described in detail later.

The controller 10 generates a control signal TDEC, an internal write enable signal WE, and a sense amplifier enable signal SE, in accordance with various control signals (WEN, CLK, CEN, and RS) from an external control terminal of the memory unit 2 and with a control signal SDBL.

A control signal WEN is a write enable signal that identifies a reading command and a writing command. A clock CLK is a clock signal serving as a reference of reading/writing operation.

A control signal CEN is a clock enable signal for controlling a validity/invalidity of the clock signal.

A control signal RS is a signal for instructing the memory unit 2 to enter a low power consumption mode (resume standby mode).

A control signal BBS is a signal for applying the substrate bias voltage to the memory unit 2.

The I/O buffer circuit 26 takes in a data input signal Di from the external data terminal of the memory unit 2 and transmits the data input signal Di to the write driver 22, and takes in an output signal from the sense amplifier circuit 24 and outputs as a data output signal Do to the external data terminal.

The write driver 22 differentially amplifies a data from the I/O buffer circuit 26 in response to the internal write enable signal WE, and transmits the data to a predetermined pair of bit lines through the column selection circuit 18 described above.

The sense amplifier circuit 24 differentially amplifies a signal pair transmitted from a predetermined pair of bit lines via YSW by using the sense amplifier enable signal SE as a trigger, and outputs the signal pair to the I/O buffer circuit 26.

Figure 2:
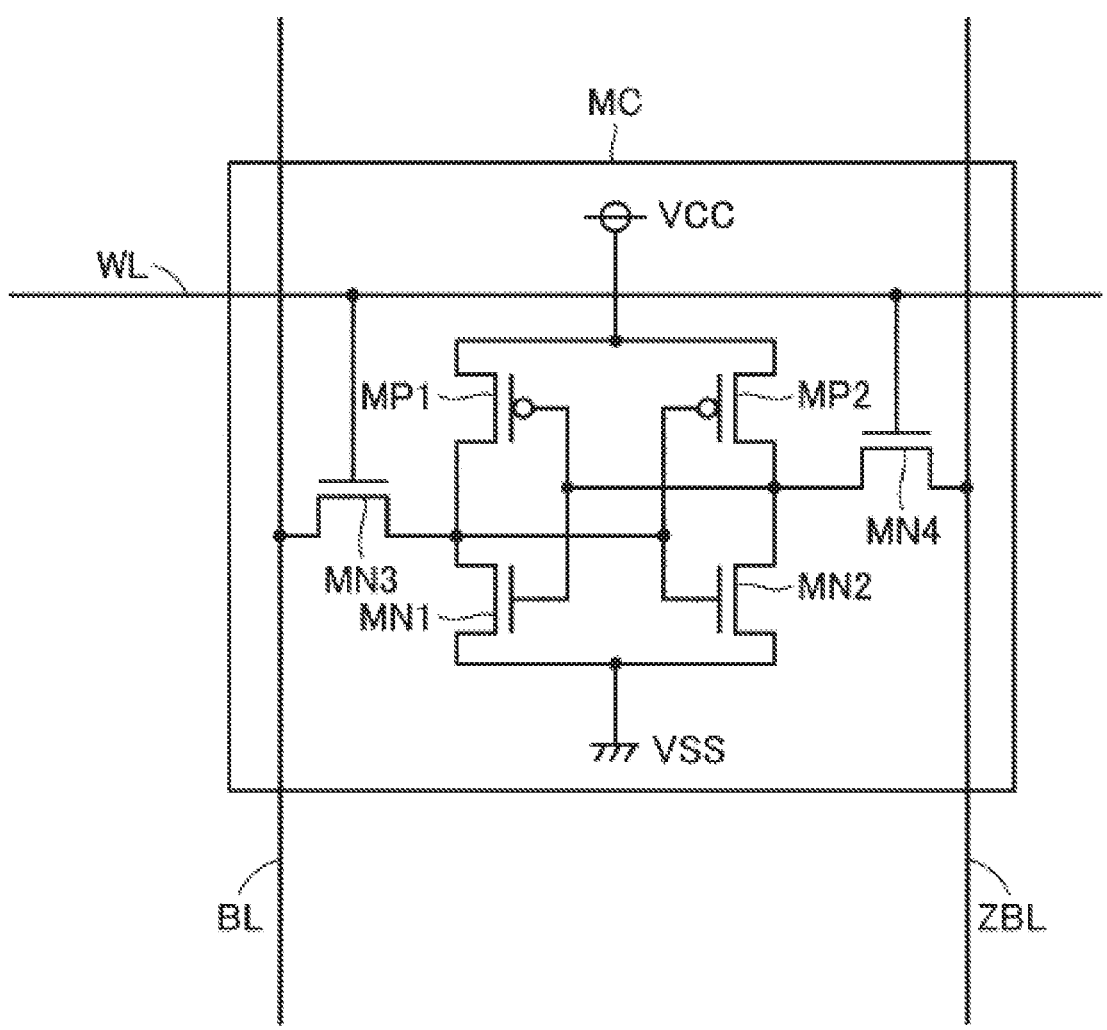
FIG. 2 is a diagram illustrating a configuration of a memory cell MC according to the first embodiment.

FIG. 2 is a diagram illustrating a configuration of the memory cell MC according to the first embodiment. Referring to FIG. 2, a SRAM memory cell includes four NMOS transistors MN1~MN4 and two PMOS transistors MP1 and MP2.

The N-channel MOS transistor MN3 has its gate connected to the word line WL and one of its source/drain connected to a positive side bit line BL. The N-channel MOS transistor MN4 has its gate connected to WL and one of its source/drain connected to a negative side bit line ZBL. The N-channel MOS transistor MN1 and the P-channel MOS transistor MP1 constitute a CMOS inverter circuit between a power supply voltage VCC and a grounding power supply voltage VSS, and the N-channel MOS transistor MN2 and the P-channel MOS transistor MP2 constitute a CMOS inverter circuit between the power supply voltage VCC and the grounding power supply voltage VSS, respectively. The two CMOS inverter circuits constitute a latching circuit by one of their inputs being connected to the other of their outputs. The other of the source/drain of the N-channel MOS transistor MN4 is connected to the input of the CMOS inverter circuit (MN1,MP1) (the output of the CMOS inverter circuit (MN2,MP2)), and the other of the source/drain of the N-channel MOS transistor MN3 is connected to the input of the CMOS inverter circuit (MN2,MP2) (the output of the CMOS inverter circuit (MN1,MP1)). The substrate bias voltage VBN is supplied to the N-channel MOS transistors MN1, MN2, MN3, and MN4, and the substrate bias voltage VBP is supplied to the P-channel MOS transistors MP1 and MP2.

Figure 3:
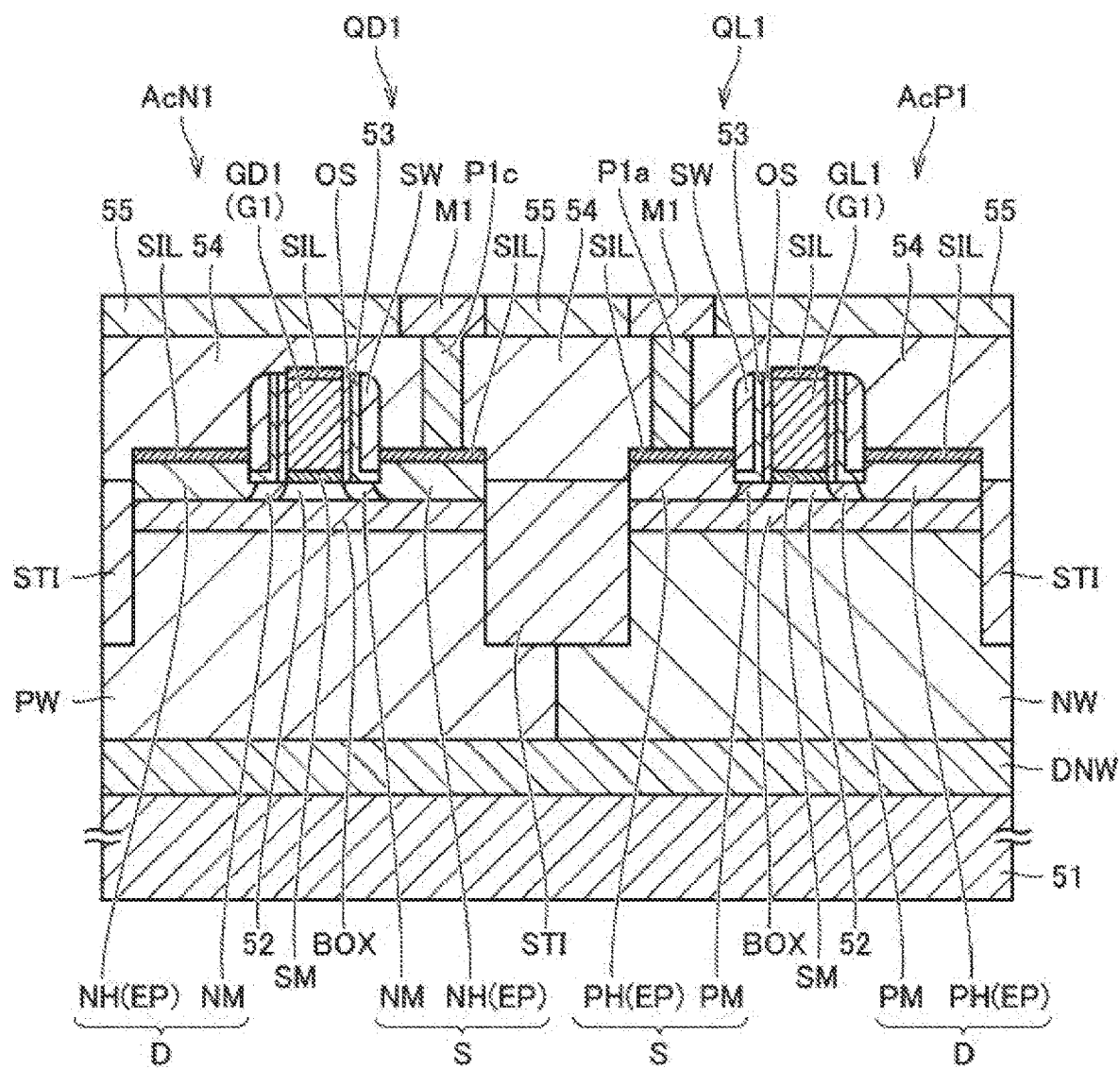
FIG. 3 is a diagram to explain a structure of N-channel and P-channel MOS transistors according to the first embodiment.

FIG. 3 is a diagram illustrating a structure of an N-channel MOS transistor and a P-channel MOS transistor according to the first embodiment.

As shown in FIG. 3, the MOS transistor according to the first embodiment is formed on an SOI substrate. Specifically, the MOS transistor according to the first embodiment is an SOTB (Silicon on Thin Buried Oxide) transistor.

The SOI substrate comprises a semiconductor substrate (supporting substrate, substrate) 51 made of silicon, an insulating layer BOX, and a semiconductor layer (element forming region) SM formed on an upper portion of the insulating layer BOX. The semiconductor layer (element forming region) SM is isolated by an element isolation region STI.

Active regions AcP1 and AcN1 are partitioned (separated) by the element isolation region STI. The insulating layer BOX is made of, for example, a silicon oxide film having a thickness of about 10 nm. The insulating layer BOX insulates and separates the semiconductor layer SM from the semiconductor substrate 51 or a p-type well region PW and a n-type well region NW. The semiconductor layer SM is formed of, for example, a silicon film having a thickness of about 10 to 15 nm. In the element isolation region STI, an element isolation film such as a laminated film of a silicon oxide film (SiO) or a silicon nitride film (SiN) and a silicon oxide film (SiO) is provided.

An insulating layer BOX is disposed under the active region AcN1, and a p-type well region PW is disposed under the insulating layer BOX. An insulating layer BOX is disposed under the active region AcP1, and an n-type well region NW is disposed under the insulating layer BOX. An n-type buried well region DNW is disposed under the p-type well region PW and the n-type well region NW. The n-type buried well region DNW is disposed between the p-type well region PW the semiconductor substrate 51, and the n-type buried well region DNW is disposed between the n-type well region NW and the semiconductor substrate 51. The p-type well region PW and the n-type well region NW are formed on the main surface of the semiconductor substrate 51 inside the semiconductor substrate 51, and the semiconductor layer SM is formed on the main surface of the semiconductor substrate 51 via the insulating film BOX. The semiconductor layer SM surrounded by the isolation region STI or the main surface of the semiconductor substrate 51 surrounded by the isolation region STI constitutes an active region. The substrate bias voltage VBN is supplied to the p-type well region PW, and the substrate bias voltage VBP is supplied to the n-type well region NW.

The structures of an N-channel MOS transistor MN1 and a P-channel MOS transistor MP1 are shown. The N-channel MOS transistor MN2 has the same configuration as that of the N-channel MOS transistor MN1. The P-channel MOS transistor MP1 has the same configuration as that of the P-channel MOS transistor MP2.

An n-type gate electrode GD1 of the N-channel MOS transistor MN1 is formed on the semiconductor layer SM in the active region AcN1 via a gate insulating film 52. For example, the gate insulating film 52 is comprised of a silicon oxynitride film having a thickness of 2 nm, but it can also be comprised of a silicon oxide film or a high dielectric constant film called a high-k film, etc. The gate electrode GD1 is formed of a polycrystalline silicon film (polysilicon film) into which an n-type impurity is introduced. The gate insulating film 52 is a very thin film, and is thinner than the thickness of the insulating film BOX or the element isolation film, for example.

In the channel length direction (lateral direction in FIG. 3) of the N-channel MOS transistor MN1, the gate electrode GD1 has opposed side walls, and an offset spacers OS made of a silicon nitride film are formed on the side walls to cover the entire side wall of the gate electrode GD1. An insulating film 53 made of a silicon oxide film and a sidewall insulating film SW made of a silicon nitride film are formed on the offset spacer OS. The insulating film 53 and the sidewall insulating film SW cover the entire sidewall of the gate electrode GD1 via the offset spacers OS.

In the channel length direction, an n-type low concentration semiconductor region NM and an n-type high concentration semiconductor region NH are formed on both sides of the gate electrode GD1 so as to sandwich the gate electrode GD1, respectively, and the n-type low concentration semiconductor region NM and the n-type high concentration semiconductor region NH are the source region S or the drain region D of the N-channel MOS transistor MN1. An n-type impurity concentration of the n-type high concentration semiconductor region NH is higher than an n-type impurity concentration of the n-type low concentration semiconductor region NM, and the n-type high concentration semiconductor region NH is arranged farther from the gate electrode GN1 than the n-type low concentration semiconductor region NM. The n-type low concentration semiconductor region NM and the n-type high concentration semiconductor region NH are in contact with the insulating layer BOX. The n-type high-concentration semiconductor region NH is formed across the semiconductor layer SM and the epi layer EP in which a silicon is selectively grown on the semiconductor layer SM.

Silicide layers SIL are formed on the surfaces (upper surface) of the gate electrode GD1 and the n-type high-concentration semiconductor region NH, and the resistances of the source region S, the drain region D, and the gate electrode GD1 of the N-channel MOS transistor MN1 are reduced. The source region S of the N-channel MOS transistor MN1 is connected to a first-layer interconnection M1, which is a conductor, through a plug conductor layer P1c, which is a conductor. The plug conductor layer P1c is provided in the interlayer insulating film 54 covering the N-channel MOS transistor MN1. The first layer wiring M1 is formed in a wiring groove provided in the insulating film 55.

The p-type gate electrode GL1 of the P-channel MOS transistor MP1 is formed on the semiconductor layer SM in the active region AcP1 via the gate insulating film 52. For example, the gate insulating film 52 is comprised of a silicon oxynitride film having a thickness of 2 nm, but it can also be comprised of a silicon oxide film or a high dielectric constant film called a high-k film, etc. The gate electrode GL1 is formed of a polycrystalline silicon film (polysilicon film) into which a p-type impurity is introduced.

In the channel length direction (lateral direction in FIG. 3) of the P-channel MOS transistor MP1, the gate electrode GL1 has opposed side walls, and an offset spacers OS made of a silicon nitride film are formed on the side walls to cover the entire side wall of the gate electrode GL1. An insulating film 53 made of a silicon oxide film and a sidewall insulating film SW made of a silicon nitride film are formed on the offset spacer OS. The insulating film 53 and the sidewall insulating film SW cover the entire sidewall of the gate electrode GL1 via the offset spacer OS.

In the channel length direction, a p-type low concentration semiconductor region PM and a p-type high concentration semiconductor region PH are formed on both sides of the gate electrode GL1 so as to sandwich the gate electrode GL1, respectively, and the p-type low concentration semiconductor region PM and the p-type high concentration semiconductor region PH are the source region S or the drain region D of the P-channel MOS transistor MP1. The p-type impurity concentration of the p-type high concentration semiconductor region PH is higher than the p-type impurity concentration of the p-type low concentration semiconductor region PM, and the p-type high concentration semiconductor region PH is arranged farther from the gate electrode GL1 than the p-type low concentration semiconductor region PM. The p-type low concentration semiconductor region PM and the p-type high concentration semiconductor region PH are in contact with the insulating layer BOX. The p-type high-concentration semiconductor region PH is formed across the semiconductor layer SM and the epi layer EP in which a silicon is selectively grown on the semiconductor layer SM.

Silicide layers SIL are formed on the surfaces (upper surface) of the gate electrode GL1 and the p-type high-concentration semiconductor region PH, and the resistances of the source region S, the drain region D, and the gate electrode GL1 of the P-channel MOS transistor MP1 are reduced. The source region S of the P-channel MOS transistor MP1 is connected to the first-layer interconnection M1, which is a conductor, through a plug conductor layer P1a, which is a conductor. The plug conductor layer P1a is provided in the interlayer insulating film 54 covering the P-channel MOS transistor MP1. The first layer wiring M1 is formed in a wiring groove provided in the insulating film 55. The first layer wiring M1 connected to the source area S of the P-channel MOS transistor MP1 is connected to a power supply potential wiring VCC formed of the second layer wiring M2.

Here, the silicide layer SIL is composed of, for example, a cobalt silicide (CoSi) layer, a titanium silicide (TiSi) layer, a nickel silicide (NiSi) layer, a platinum (Pt)-containing nickel silicide (NiSi) layer, or the like.

The plug conductor layers P1c and P1a have a laminated structure of a barrier conductor film such as a tungsten nitride (TiW) film or a titanium nitride (TiN) film, and a main conductor film of tungsten (W). The other plug conductor layers P1b, P1d, P1e, P1f, P1g, P1h, P1i, P1j and the shared conductor layer SC have the same structure as the plug conductor layers P1c and P1a.

The first layer wiring M1 is a copper wiring, and is composed of a laminated structure of a barrier conductor film and a main conductor film mainly composed of copper in an upper layer thereof. The barrier conductor film is composed of tantalum (Ta), titanium (Ti), ruthenium (Ru), tungsten (W), manganese (Mn), nitrides or silicides thereof, or a laminated film thereof. The main conductor film mainly made of copper is formed of copper (Cu) or a copper alloy (copper (Cu) and any of aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), or In (indium), a lanthanide-based metal, or an alloy such as an actinoid-based metal).

The interlayer insulating film 54 is formed of a silicon oxide film (SiO), and the insulating film 55 is formed of a silicon oxide film (SiO), but may be formed of a single layer film or a stacked layer film of a silicon oxide film containing carbon (SiOC film), a silicon oxide film containing nitrogen and carbon (SiCON film), or a silicon oxide film containing fluorine (SiOF film).

Figure 4:
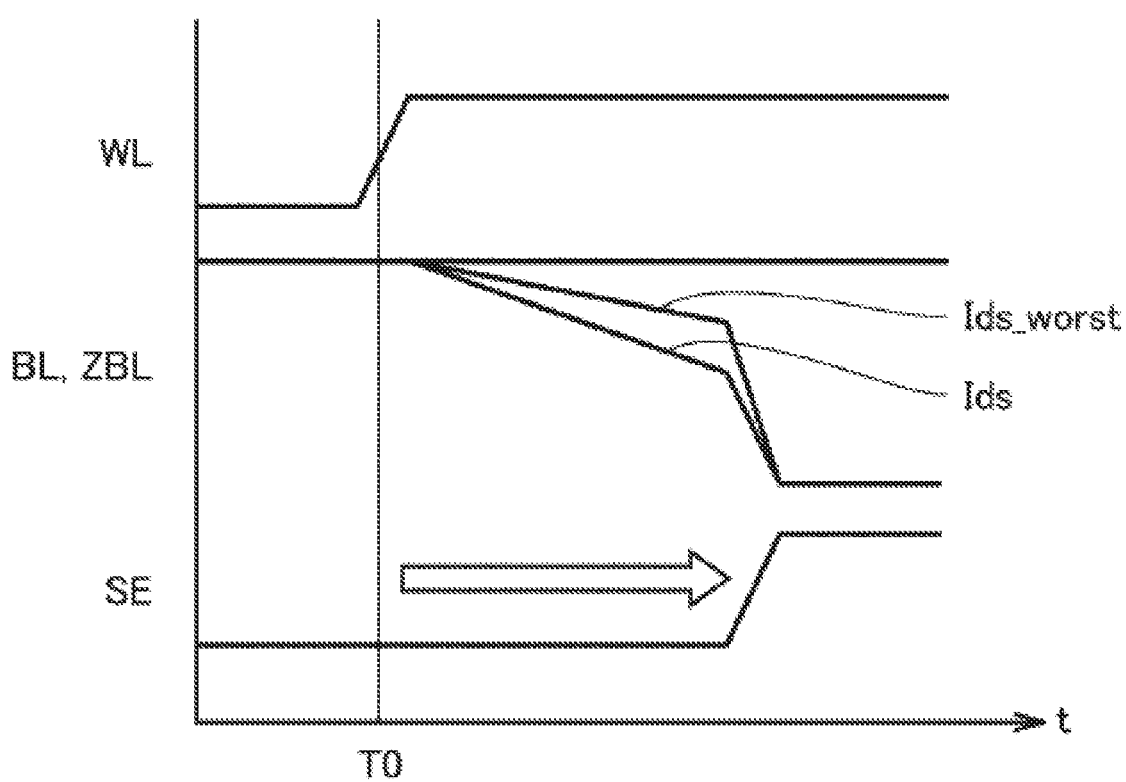
FIG. 4 is a diagram to explain an operation at the time of data reading of memory unit 2 according to the first embodiment.

FIG. 4 is a diagram for explaining an operation of the memory unit 2 according to the first embodiment at the time of data reading.

Referring to FIG. 4, at time T0, the word line WL is activated and the data reading operation is executed.

In accordance with the data of the memory cell MC, the voltage of one of the bit lines BL and ZBL decreases. Here, in a normal time, the control signal SAE is activated after a predetermined period of time has elapsed, and the sense amplifier circuit 24 operates, and a reading data is outputted.

On the other hand, when the substrate bias voltages VBP and VBN are applied from substrate bias generation circuit 8 to memory unit 2, a threshold voltage of the transistor of memory unit 2 rises.

FIG. 5 is a diagram for explaining changes in the characteristics of the MOS transistor when substrate bias voltage is not applied to the MOS transistor and when substrate bias voltage is applied to the MOS transistor, according to the first embodiment.

As shown in FIG. 5, we will explain the case where the power supply voltage VCC is 0.8 V and a standard deviation of the variation in threshold δVt is 0.02 V.

A threshold voltage Vth of the MOS transistor is assumed to be 0.4V when substrate bias voltage is not applied to the MOS transistor. On the other hand, a threshold voltage Vth of the MOS transistor is assumed to be 0.6V when substrate bias voltage is applied.

For example, it is assumed that a variation of 5.5σ is allowed in a memory design. In this case, a worst Vth of the MOS transistor with the highest threshold is set to 0.4+5.5*0.02=0.51 V when substrate bias voltage is not applied, according to the variation of the MOS transistor. On the other hand, the worst Vth of the MOS transistor with the highest threshold is set to 0.71 V when substrate bias voltage is applied to the MOS transistor.

According to the values of the above worst Vth, a ratio of the memory cell current Ids is reduced to 0.173 times when substrate bias voltage is applied, assuming that the ratio of the memory cell current Ids is 1 time when substrate bias voltage is not applied.

On the other hand, the ratio of the current Ids_delay flowing through the delay stage is reduced to 0.354 times when the substrate bias voltage is applied, assuming that the substrate bias voltage is 1 time when substrate bias voltage is not applied.

Therefore, the current quantity differs between the case where substrate bias voltage is applied and the case where substrate bias voltage is not applied.

In other words, when substrate bias voltage is applied, the memory cell current is half the amount of current with respect to delay stage, and therefore, twice the amount of delay is required.

Figure 6:
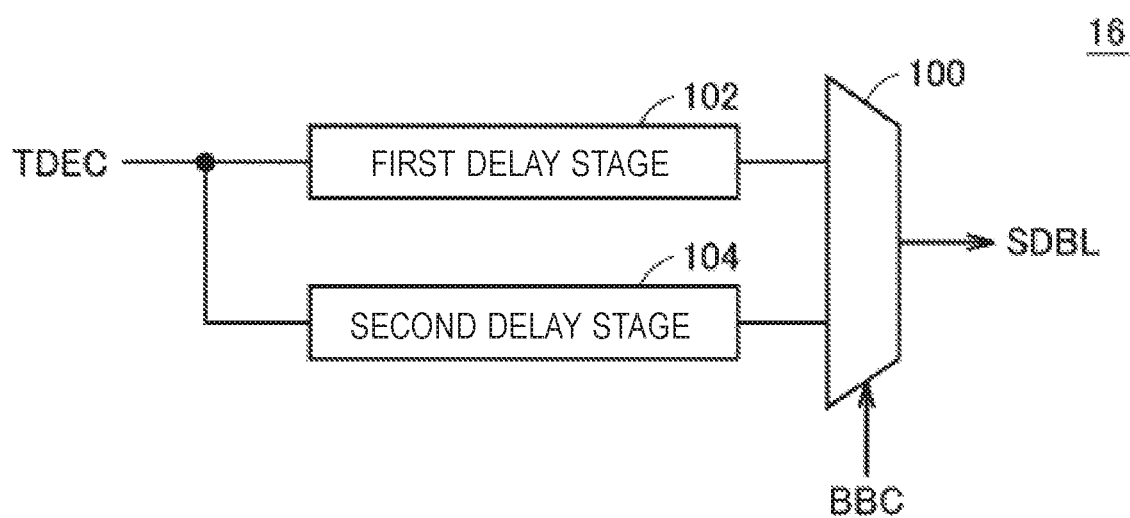
FIG. 6 is a diagram to explain a circuit configuration of a timing adjustment circuit 16 according to the first embodiment.

FIG. 6 is a diagram for explaining a circuit configuration of the timing adjustment circuit 16 according to the first embodiment.

Referring to FIG. 6, the timing adjustment circuit 16 includes two types of delay stages 102, 104 and a selector 100.

The first delay stage 102 and the second delay stage 104 receive the control signal TDEC, delay the signal for a predetermined period, and output the delayed signal to the selector 100.

The selector 100 switches the output of the first delay stage 102 or the second delay stage 104 in accordance with the control signal BBC.

Illustratively, the second delay stage 104 has twice the delay of the first delay stage 102. Specifically, when the substrate bias voltage is not applied, the timing adjustment circuit 16 outputs a signal from the first delay stage 102 as the control signal SDBL in accordance with the control signal BBC ("L" level). On the other hand, when the substrate bias voltage is applied, the timing adjustment circuit 16 outputs the signal from the second delay stage 104 as the control signal SDBL in accordance with the control signal BBC ("H" level).

Thus, when the substrate bias voltage is applied, the timing adjustment circuit 16 outputs the control signal SDBL in accordance with an operation delay of the MOS transistor due to the threshold voltage of the MOS transistor of the memory unit 2 increasing. The controller 10 generates the internal write enable signal WE and the sense amplifier enable signal SE in accordance with the control signal SDBL, so that highly accurate timing adjustment can be performed.

Second Embodiment

Figure 7:
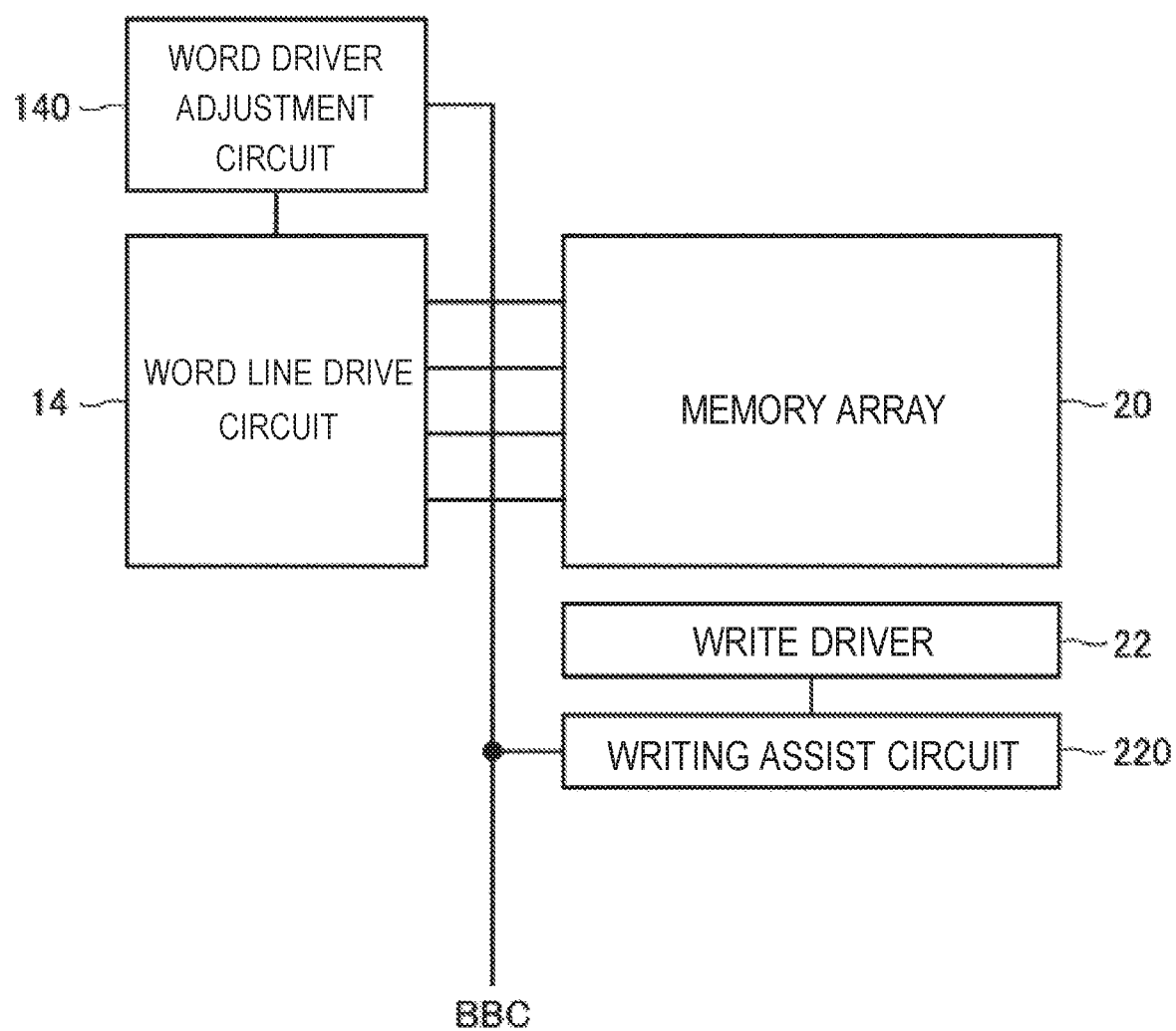
FIG. 7 is a diagram to explain an assist circuit according to a second embodiment.

FIG. 7 is a diagram illustrating an assist circuit according to the second embodiment.

Referring to FIG. 7, in this embodiment, the assist circuit used at the time of writing operation is provided.

Specifically, a word driver adjustment circuit 140 provided for the word line drive circuit 14 and a writing assist circuit 220 provided corresponding to the write driver 22 are provided.

Figure 8:
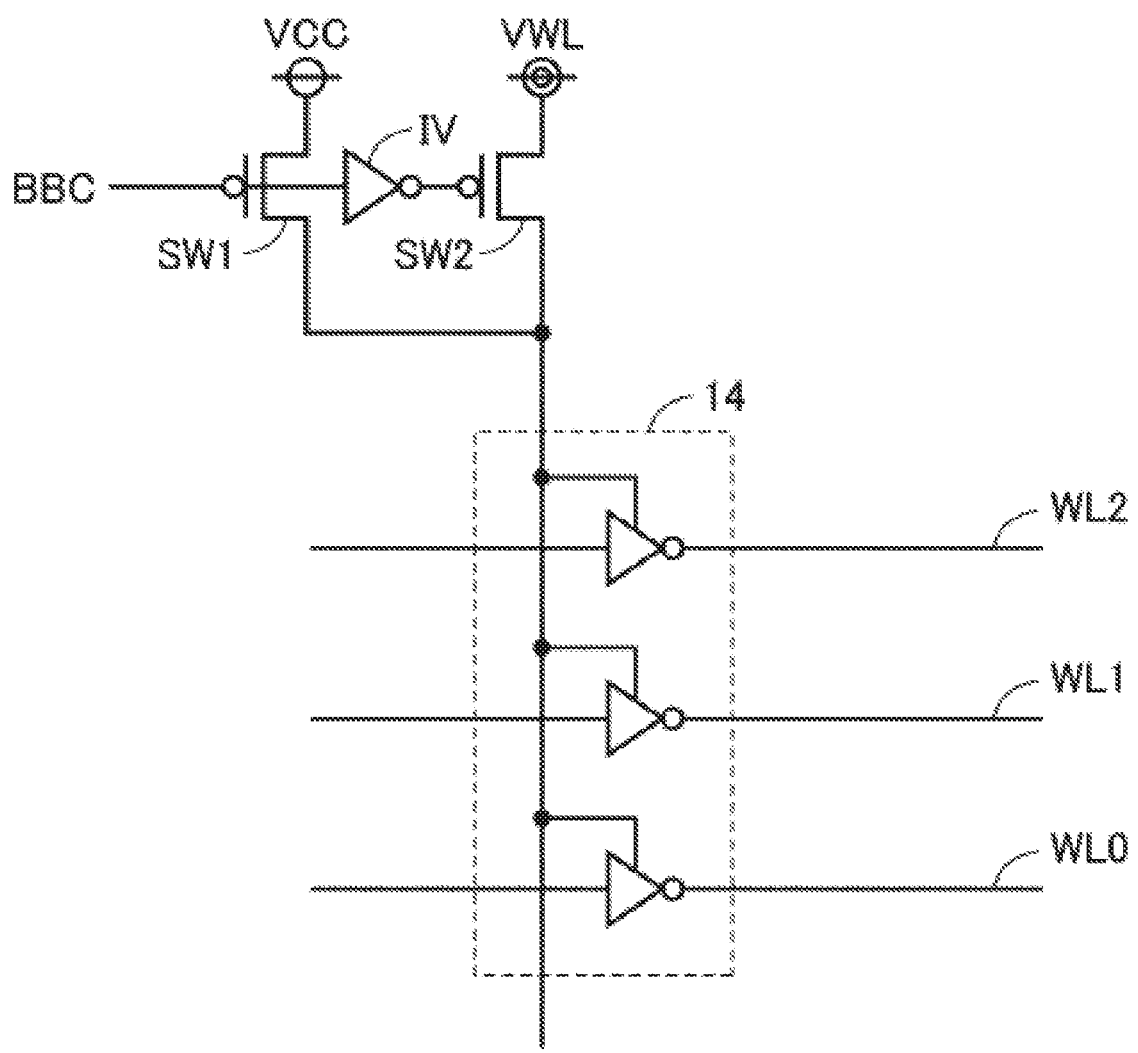
FIG. 8 is a diagram to explain a circuit configuration of the word driver adjustment circuit 140 according to the second embodiment.

FIG. 8 is a diagram for explaining a circuit configuration of the word driver adjustment circuit 140 according to the second embodiment.

Referring to FIG. 8, the word driver adjustment circuit 140 switches power supply voltages between when the substrate bias voltage is applied and when the substrate bias voltage is not applied.

Specifically, the word driver adjustment circuit 140 switches from the power supply voltage VCC to the power supply voltage VWL in accordance with the input of the control signal BBC.

The word driver adjustment circuit 140 includes switches SW1, SW2 and an inverter IV. The switch SW1 is connected to the power supply voltage VCC and the power supply node of the word line drive circuit 14, and its gate receives the control signal BBC. The switches SW1 and SW2 are P-channel MOS transistors.

The switch SW2 is connected to the power supply voltage VWL and the power supply node of the word line drive circuit 14, and its gate receives an inverted signal of the control signal BBC via the inverter IV.

The voltage of the power supply voltage VWL is higher than the voltage of the power supply voltage VCC. The switch SW1 is turned on in accordance with the input of the control signal BBC ("L" level). In this instance, the switch SW2 is turned off.

Therefore, in the normal time, the power voltage VCC is supplied to the power node of word line drive circuit 14.

On the other hand, when the substrate bias voltage is applied, the control signal BBC ("H" level) is inputted. The switch SW1 is turned off and the switch SW2 is turned on.

Therefore, when the substrate bias voltage is applied, the power supply voltage VWL is supplied to the power supply node of the word line drive circuit 14.

This enables a writing operation margin to be improved by changing the power supply voltage VCC to the power supply voltage VWL when there is a possibility that the threshold voltage of the MOS transistor is increased by the application of substrate bias voltage, and thus a writing operation margin of the MOS transistor may be lowered.

That is, even when the substrate bias voltage is applied, data can be written to the memory unit 2.

Figure 9:
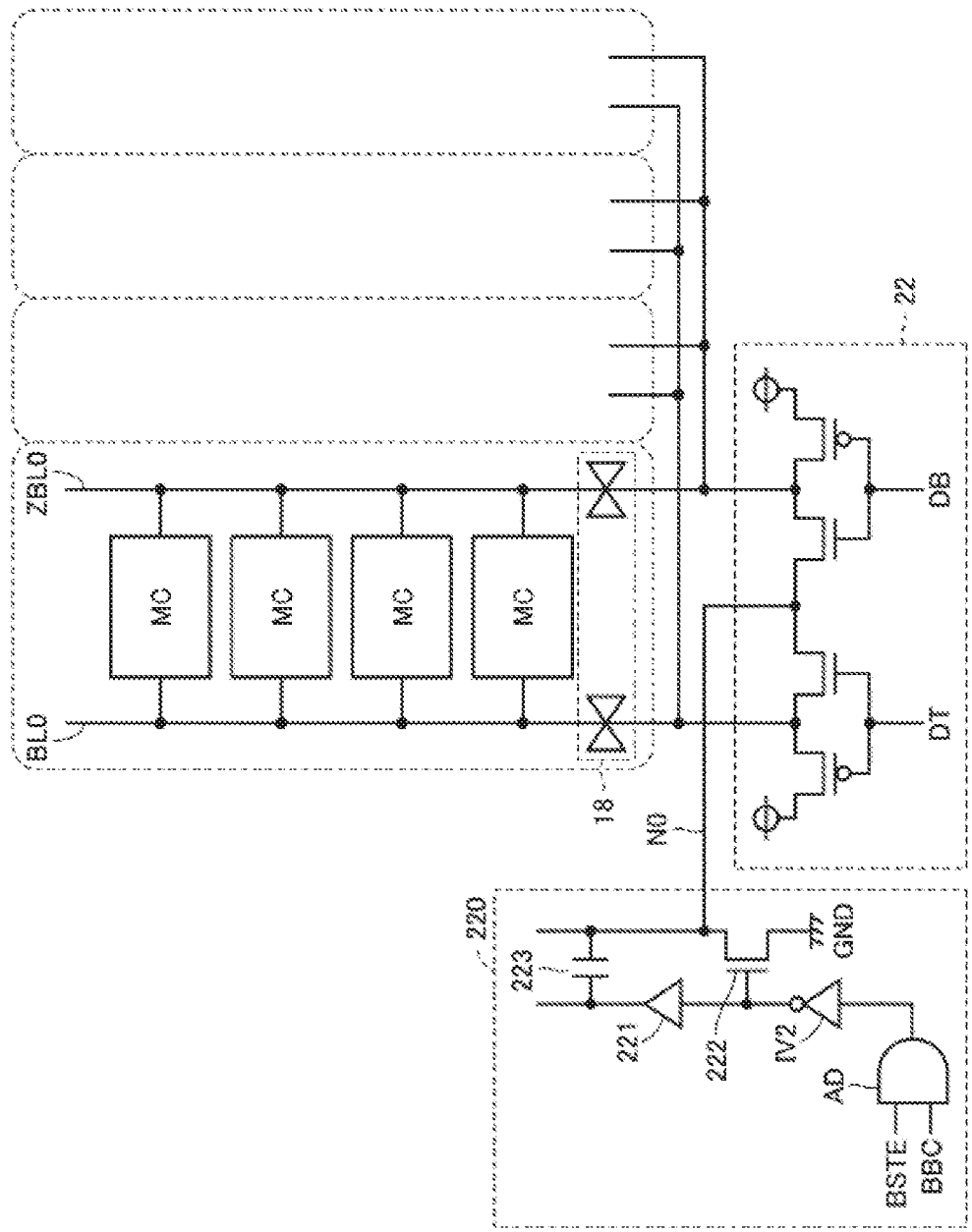
FIG. 9 is a diagram illustrating a circuit configuration of a writing assist circuit 220 according to the second embodiment.

FIG. 9 is a diagram for explaining a circuit configuration of the writing assist circuit 220 according to the second embodiment.

Referring to FIG. 9, the writing assist circuit 220 includes an AND circuit AD, an inverter IV2, a driver 221, an N-channel MOS transistor 222, and a capacitor 223.

The AND circuit AD outputs an AND logical operation result based on inputs of a control signal BSTE and the control signal BBC.

The inverter IV2 invert the output of the AND circuit AD and outputs the inverted output to the driver 221. The N-channel MOS transistor 222 is provided between a ground node N0 of the write driver 22 and the ground voltage GND, and receives the output of the inverter IV2 at its gate.

The capacitor 223 is provided between the driver 221 and the ground node N0. Next, the operation will be described.

In the normal time, the AND circuit AD outputs a "L" level. Therefore, the inverter IV2 outputs a "H" level. The N-channel MOS transistor 222 is turned on, and the ground node N0 is connected to the ground voltage GND.

When the substrate bias voltage is applied, the control signal BBC and the control signal BSTE are set to "H" level. Thus, the AND circuit AD outputs the "H" level. The inverter IV2 outputs "L" level. Therefore, the N-channel MOS transistor 222 is turned off. Since the driver 222 drives the signal line at the "L" level, the node N0 is set to a negative voltage level via the capacitor 223.

During the writing operation in the normal time, the write driver 22 sets one of the precharged bit lines BL and ZBL to the grounded voltage GND. The ground node is connected to a ground voltage.

On the other hand, when the substrate bias voltage is applied, a control signal BBC ("H" level) and a control signal BSTE ("H" level) are inputted. The N-channel MOS transistor 222 is turned off. Node N0 is then set to the negative voltage.

Therefore, when the substrate bias voltage is applied, a negative voltage is applied to the ground node.

As a result, writing operation margin can be improved by setting the grounding node N0 to the negative voltage when the threshold voltage of the MOS transistor rises due to the application of substrate bias voltage and the writing operation margin of the MOS transistor may be lowered.

That is, even when the substrate bias voltage is applied, data can be written to the memory unit 2.

Third Embodiment

Figure 10:
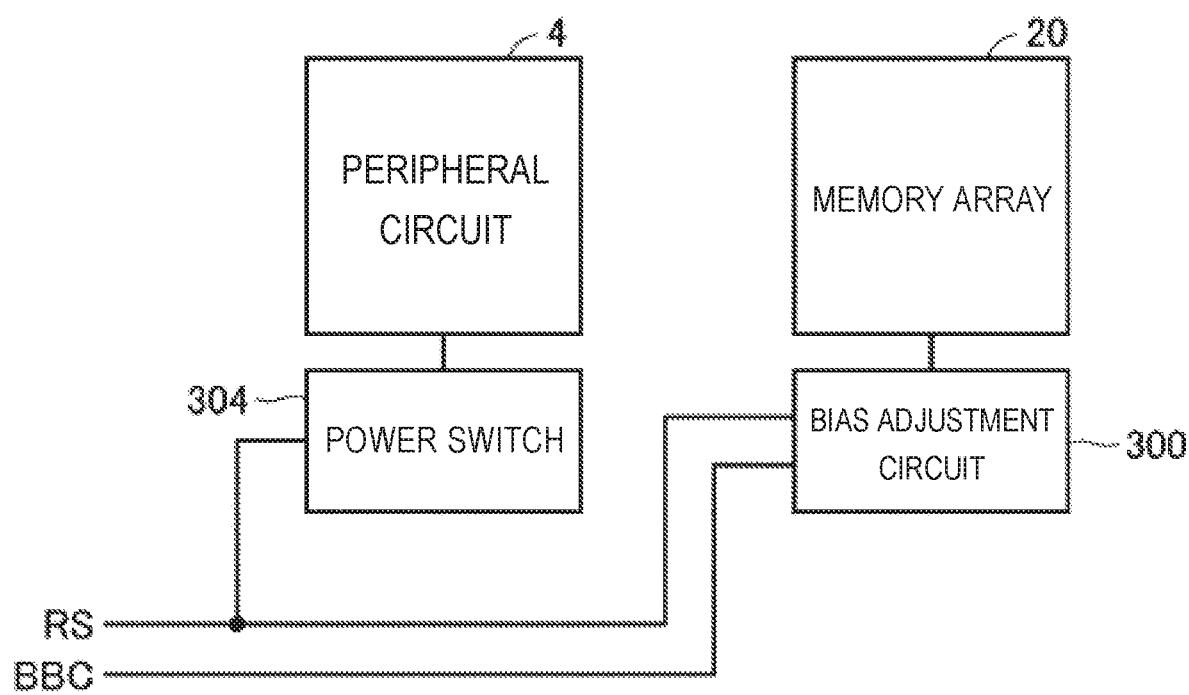
FIG. 10 is a diagram to explain a bias adjustment circuit according to a third embodiment.

FIG. 10 is a diagram illustrating a bias adjustment circuit according to a third embodiment.

Referring to FIG. 10, in the present embodiment, a power switch 304 and a bias adjustment circuit 300 are provided for use in the low power consumption mode (resume standby mode).

More specifically, the power switch 304 is connected to the peripheral circuit 4, and stops supplying power according to the control signal RS. As a result, the power consumed by the peripheral circuit 4 can be reduced.

A bias adjustment circuit 300 is provided for the memory array 20 and reduces a power consumption of the memory array 20. Specifically, the power consumption is reduced by suppressing the through current flowing through the memory cells MC of the memory array 20.

Figure 11:
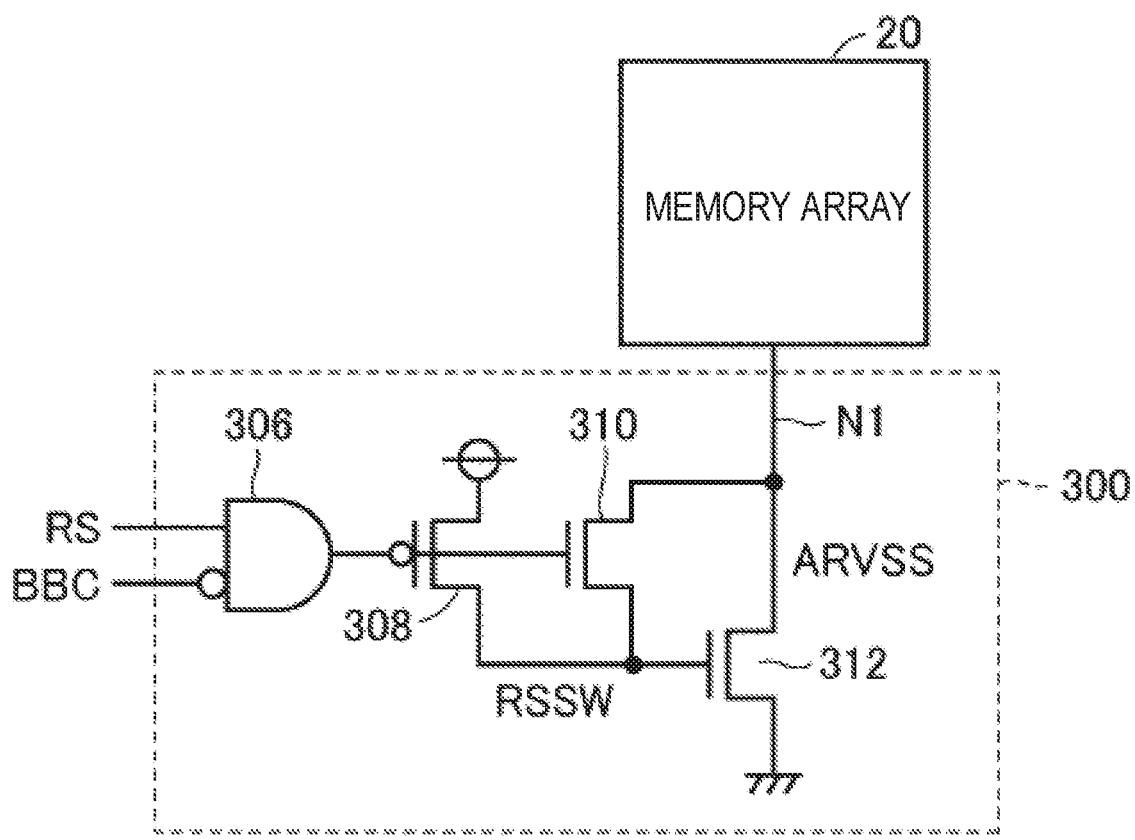
FIG. 11 is a diagram of a circuit structure of a bias adjustment circuit 300.

FIG. 11 is a schematic diagram of the bias adjustment circuit 300. Referring to FIG. 11, the bias adjustment circuit 300 includes an AND circuit 306, a P-channel MOS transistor 308, and N-channel MOS transistors 310 and 312.

The N-channel MOS transistor 312 is provided between the ground node N1 of the memory cell MC and the ground voltage GND. The N-channel MOS transistor 310 is connected to the ground node N1 and the gate of the N-channel MOS transistor 312, and the gate thereof receives an output of the AND circuit 306.

The P-channel MOS transistor 308 is connected to the gate of the power supply voltage VCC and the N-channel MOS resistor 312, and the gate receives the output of the AND circuit 306.

The AND circuit 306 is inputted the control signal RS and the inverted signal of the control signal BBC, and outputs an AND logic operation result to the gates of the P-channel MOS transistor 308 and the N-channel MOS transistor 310.

In the normal time, the control signal RS is set to the "L" level. Therefore, the AND circuit 306 outputs the "L" level. Therefore, the P-channel MOS transistor 308 is turned on and the N-channel MOS transistor 310 is turned off.

Since the P-channel MOS transistor 308 is turned on, a voltage RSSW is set to "H" level. Therefore, the N-channel MOS transistor 312 is turned on. The voltage ARVSS is set to a grounded voltage GND level.

In the low power consumption mode (resume standby mode), the control signal RS is set to "H" level. In this case, it is assumed that the substrate bias voltage is not applied. That is, the control signal BBC is at the "L" level. The AND circuit 306 is set to "H" level.

Therefore, the P-channel MOS transistor 308 is turned off. The N-channel MOS transistor 310 is turned on. Thus, the node N1 and the gate of the N-channel MOS transistor 312 are electrically connected to each other. That is, the N-channel MOS transistor 312 is in a diode connected state. This causes the voltage ARVSS to rise from the grounded voltage GND level by the diode connected amount. As a result, since the ground node N1 of the memory cell MC becomes high, it is possible to reduce the amount of through current flowing through the memory cell MC.

On the other hand, when the substrate bias voltage is applied in the low power consumption mode (resume standby mode mode), the threshold voltage of the memory cell MC rises. As a result, if the voltage of the ground node N1 of the memory cell MC is high, a retention margin of the memory cell MC becomes small, and data may be destroyed.

Therefore, when the substrate bias voltage is applied, the assist function is turned off in the low power consumption mode (resume standby mode). That is, when the control signal RS is at the "H" level and the control signal BBC is at the "H" level, the AND circuit 306 outputs the "L" level.

As a result, the N-channel MOS transistor 312 is turned on, and the voltage ARVSS is set to the grounded voltage GND.

Thus, the assist function is turned off when the threshold voltage of the MOS transistor increases due to the application of the substrate bias voltage, so that the retention margins of the MOS transistor may be lowered. In other words, by disabling the bias adjustment circuit 300, a data holding margin can be improved.

That is, even when the substrate bias voltage is applied, a data holding characteristic of the memory unit 2 can be maintained.

Fourth Embodiment

In the fourth embodiment, a timing adjustment of the control signal RS will be described.

Figure 12:
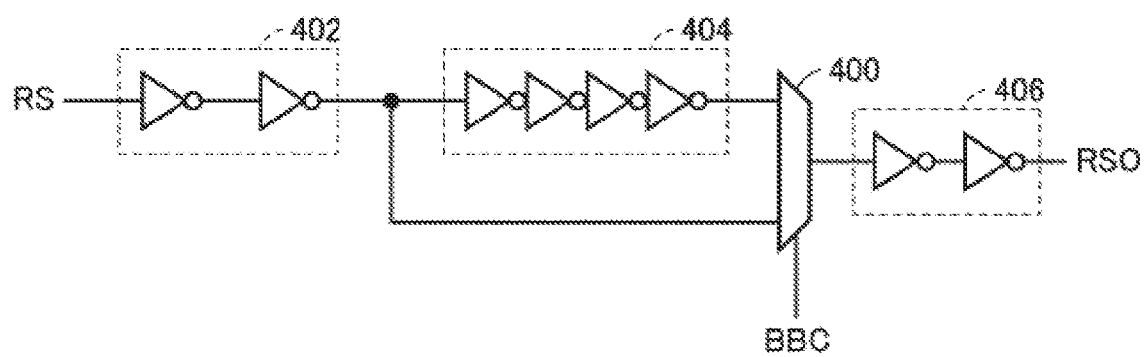
FIG. 12 is a schematic diagram of a timing adjustment circuit according to a fourth embodiment.

FIG. 12 is a circuit configuration diagram of the timing adjustment circuit according to the fourth embodiment. With reference to FIG. 12, the timing adjustment of the control signal RS will be described in this example.

Inverter groups 402, 404, 406 and a selector 400 are included. The selector 400 selects a delay signal through the inverter groups 402 and 404 of the control signal RS and the delay signal through the inverter group 402.

The delay signal selected by the selector 400 is output as a control signal RSO via the inverter group 406.

The selector 400 switches the delay signal according to the control signal BBC. For example, when the substrate bias voltage is not applied to the selector 400, the selector 400 selects the delay signal through the inverter groups 402 and 404 in accordance with the control signal BBC ("L" level), and outputs the delay signal as the control signal RSO through the inverter group 406.

On the other hand, when the substrate bias voltage is applied, the selector 400 selects the delay signal via the inverter group 402 in accordance with the control signal BBC ("H" level), and outputs the delay signal as the control signal RSO via the inverter group 406.

As a result, the timing adjustment circuit can add a predetermined delay to the control signal RS instructing to enter the low power consumption mode (resume standby mode) and outputs the delayed control signal RSO.

On the other hand, when the substrate bias voltage is applied, an operation delay of the MOS transistor occurs due to an increase in the threshold voltage of the MOS transistor. Therefore, the control signal RSO is outputted more slowly than the control signal RSO when no substrate bias voltage is applied to the control signal RSO.

In this case, even when the low power consumption mode (resume standby mode) is canceled, the mode is not canceled immediately, and the time may take a long time.

Therefore, when the substrate bias voltage is applied, a path that does not pass through the group of inverters 404 is provided in view of the operation delay of the MOS transistor due to an increased threshold voltage of the MOS transistor. Then, the control signal RSO is output using the signal of the path.

As a result, even when the low power consumption mode (resume standby mode) is canceled, the timing can be adjusted by changing the delay amount. This makes it possible to suppress unnecessary operation delay and to perform timing adjustment with high accuracy.

Although the present disclosure has been specifically described based on the embodiments described above, the present disclosure is not limited to the embodiments, and it is needless to say that various modifications can be made without departing from the gist thereof.

What is claimed is:

1. A semiconductor device comprising:
a memory circuit including a memory cell comprised of a Silicon on Thin Buried Oxide (SOTB) transistor; and
a mode designation circuit switching an operation mode of the memory circuit between a first mode and a second mode,
wherein the memory circuit includes:
a substrate bias generation circuit supplying a substrate bias voltage to the SOTB transistor in the first mode, wherein the substrate bias generation circuit does not supply the substrate bias voltage to the SOTB transistor in the second mode; and
a timing signal generation circuit generating a timing signal used for a reading operation or a writing operation of the memory circuit, wherein the timing signal generation circuit generates a first timing signal using a first delay stage in the first mode and a second timing signal using a second delay stage in the second mode, and wherein the timing signal generation circuit includes a selector circuit for switching an output of the first timing signal and the second timing signal such that the first timing signal from the first delay stage is output in the first mode and the second timing signal from the second delay stage is output in the second mode.

2. The semiconductor device according to claim 1, wherein in the first mode, the substrate bias generation circuit supplies the substrate bias voltage to the SOTB transistor.

3. The semiconductor device according to claim 1, wherein the memory circuit operate in a first speed in the first mode and operate in a second speed faster than the first speed in the second mode.

4. The semiconductor device according to claim 1, wherein a threshold voltage of the SOTB transistor when the SOTB transistor is supplied with the substrate bias voltage is higher than a threshold voltage of the SOTB transistor when the SOTB transistor is not supplied with the substrate bias voltage.

5. The semiconductor device according to claim 1,
wherein the memory circuit includes an assist circuit capable of assisting a writing operation of the memory circuit,
wherein the assist circuit operates in the first mode, and
wherein the assist circuit does not operate in the second mode.

6. The semiconductor device according to claim 5,
wherein the memory circuit includes a pair of bit lines connected to the memory cells, and
wherein the assist circuit changes a voltage of one bit line of the pair of bit lines from a first voltage to a second voltage lower than the first voltage during the writing operation.

7. The semiconductor device according to claim 6, wherein the memory circuit includes an activation circuit for activating the assist circuit in the first mode.

8. The semiconductor device according to claim 5,
wherein the memory circuit includes a word line connected to the memory cell, and
wherein the assist circuit changes a voltage of the word line from a third voltage to a fourth voltage higher than the third voltage during the writing operation.

9. The semiconductor device according to claim 1,
wherein the memory circuit includes an adjustment circuit adjusting the substrate bias voltage of the memory circuit, and
wherein the adjustment circuit operates in the second mode and does not operate in the first mode.

10. The semiconductor device according to claim 9,
wherein the adjustment circuit includes a switch circuit disposed between a ground wiring and the memory cell, and
wherein the switch circuit is turned off in the second mode and turned on in the first mode.

11. A semiconductor device comprising:
a memory circuit including a memory cell comprised of a Silicon on Thin Buried Oxide (SOTB) transistor; and
a mode designation circuit designating an operation speed of the memory circuit,
wherein the memory circuit includes:
    a substrate bias generation circuit supplying a substrate bias voltage to the SOTB transistor, wherein the substrate bias generation circuit supplies the SOTB transistors with the substrate bias voltage when the mode designation circuit designates a first mode for operating the memory circuit in a first speed, and wherein the substrate bias generation circuit does not provide the SOTB transistor with the substrate bias voltage when the mode designation circuit designates a second mode for operating the memory circuit at a second speed faster than the first speed;
    an assist circuit assisting a writing operation of the memory circuit, wherein the assist circuit operates when the first mode is designated, and wherein the assist circuit does not operate when the second mode is designated; and
    a timing signal generation circuit generating a timing signal used for a reading operation or a writing operation of the memory circuit, wherein the timing signal generation circuit generates a first timing signal using a first delay stage in the first mode and a second timing signal using a second delay stage in the second mode, and wherein the timing signal generation circuit includes a selector circuit for switching an output of the first timing signal and the second timing signal such that the first timing signal from the first delay stage is output in the first mode and the second timing signal from the second delay stage is output in the second mode.

12. A semiconductor device comprising:
a memory circuit including a memory cell comprised of a Silicon on Thin Buried Oxide (SOTB) transistor; and
a mode designation circuit designating an operation speed of the memory circuit,
wherein the memory circuit includes:
    a substrate bias generation circuit supplying a substrate bias voltage to the SOTB transistor, wherein the SOTB transistor is supplied with the substrate bias voltage when the mode designation circuit designates a first mode for operating the memory circuit in a first speed, and wherein the bias does not provide the substrate bias voltage to the SOTB transistor when the mode designation circuit designates a second mode for operating the memory circuit at a second speed faster than the first speed;
    an adjustment circuit adjusting the substrate bias voltage of the memory circuit, wherein the adjustment circuit operates when the first mode is designated, and wherein the adjustment circuit does not operate when the second mode is designated; and
    a timing signal generation circuit generating a timing signal used for a reading operation or a writing operation of the memory circuit, wherein the timing signal generation circuit generates a first timing signal using a first delay stage in the first mode and a second timing signal using a second delay stage in the second mode, and wherein the timing signal generation circuit includes a selector circuit for switching an output of the first timing signal and the second timing signal such that the first timing signal from the first delay stage is output in the first mode and the second timing signal from the second delay stage is output in the second mode.

* * * * *